(12) United States Patent
Kim et al.

(10) Patent No.: US 12,334,337 B2
(45) Date of Patent: Jun. 17, 2025

(54) INTEGRATED FLOWABLE LOW-K GAP-FILL AND PLASMA TREATMENT

(71) Applicant: Applied Materials, Inc., Santa Clara, CA (US)

(72) Inventors: Myungsun Kim, Pleasanton, CA (US); Jingmei Liang, San Jose, CA (US); Martin J. Seamons, San Jose, CA (US); Michael Stolfi, Clifton Park, NY (US); Benjamin Colombeau, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 17/386,724

(22) Filed: Jul. 28, 2021

(65) Prior Publication Data
US 2022/0037147 A1 Feb. 3, 2022

Related U.S. Application Data (60) Provisional application No. 63/065,610, filed on Aug. 14, 2020, provisional application No. 63/060,083, filed on Aug. 2, 2020.

(51) Int. Cl.
*H01L 21/02* (2006.01)
*H01L 21/311* (2006.01)
*H10D 30/01* (2025.01)
*H10D 86/01* (2025.01)

(52) U.S. Cl.
CPC .... *H01L 21/0234* (2013.01); *H01L 21/02532* (2013.01); *H01L 21/31111* (2013.01); *H10D 30/031* (2025.01); *H10D 86/0212* (2025.01)

(58) Field of Classification Search
CPC ......... H01L 29/0665; H01L 21/823418; H01L 27/088; H01L 21/0259; H01L 29/0843
See application file for complete search history.

(56) References Cited

U.S. PATENT DOCUMENTS

| 7,517,775 B2 | 4/2009 | Kim et al. |
| 8,207,044 B2 | 6/2012 | Mani et al. |
| 8,357,435 B2 | 1/2013 | Lubomirsky et al. |

(Continued)

FOREIGN PATENT DOCUMENTS

| KR | 100630764 B1 | 10/2006 |
| KR | 20160100929 A | 8/2016 |

OTHER PUBLICATIONS

Hellings, G., et al., "Si/SiGe superlattice I/O finFETs in a vertically-stacked Gate-All-Around horizontal Nanowire Technology", 2018 Symposium on VLSI Technology Digest of Technical Papers, downloaded May 27, 2021 from IEEE Xplore, two pages.

(Continued)

*Primary Examiner* — Brian Turner
(74) *Attorney, Agent, or Firm* — SERVILLA WHITNEY LLC (57) ABSTRACT

Provided are methods of depositing a film in high aspect ratio (AR) structures with small dimensions. The method provides flowable deposition for seamless gap-fill, film densification by low temperature inductively coupled plasma (ICP) treatment (<600° C.), optional film curing, and etch back to form a low-k dielectric film having a dielectric constant, k-value less than 3.

16 Claims, 9 Drawing Sheets

(56) References Cited

U.S. PATENT DOCUMENTS

| | | |
|---|---|---|
| 9,741,584 B1 | 8/2017 | Park et al. |
| 10,103,027 B2 | 10/2018 | Swenberg et al. |
| 10,332,881 B1 | 6/2019 | Badaroglu et al. |
| 2013/0112702 A1 | 8/2013 | Ahmed et al. |
| 2014/0213070 A1 | 7/2014 | Hong et al. |
| 2014/0302688 A1* | 10/2014 | Underwood ...... H01L 21/02126 438/786 |
| 2015/0147879 A1* | 5/2015 | Chatterjee ......... H01L 23/53238 438/653 |
| 2015/0243545 A1* | 8/2015 | Tang ................. H01L 21/76837 118/704 |
| 2016/0020089 A1* | 1/2016 | Thadani ............ H01L 21/02126 438/786 |
| 2016/0254382 A1 | 9/2016 | Hoentschel et al. |
| 2017/0018462 A1 | 1/2017 | Suk et al. |
| 2017/0229553 A1 | 8/2017 | Basker et al. |
| 2017/0278865 A1 | 9/2017 | Ching et al. |
| 2018/0240871 A1 | 8/2018 | Cheng et al. |
| 2018/0330980 A1* | 11/2018 | Liang ................ H01L 21/02274 |
| 2019/0080903 A1* | 3/2019 | Abel .................... H01L 21/0228 |
| 2019/0115438 A1 | 4/2019 | Ching et al. |
| 2019/0229011 A1* | 7/2019 | Suk .................... H01L 29/78654 |
| 2020/0111704 A1* | 4/2020 | Kozarsky ........ H01L 21/823807 |
| 2020/0168715 A1 | 5/2020 | Wu et al. |
| 2020/0303500 A1* | 9/2020 | Loubet ................... B82Y 10/00 |
| 2020/0357884 A1* | 11/2020 | Xie ....................... H01L 29/165 |
| 2021/0098292 A1* | 4/2021 | Nguyen ............ H01L 21/02126 |
| 2021/0193797 A1* | 6/2021 | Xie ...................... H01L 29/0665 |
| 2021/0335657 A1* | 10/2021 | Lu ....................... H01L 21/0217 |

OTHER PUBLICATIONS

Joo, Sangrae, et al., "Study of Silicon Oxidation in a Remote Plasma-Enhanced Rapid Thermal Processor", Journal of the Korean Physical Society, vol. 51, No. 4, Oct. 2007, pp. 1337-1343.

PCT International Search Report and Written Opinion in PCT/US2021/043822 dated Nov. 18, 2021, 11 pages.

\* cited by examiner

INTEGRATED FLOWABLE LOW-K GAP-FILL AND PLASMA TREATMENT

CROSS-REFERENCE TO RELATED APPLICATIONS

This application claims priority to U.S. Provisional Application No. 63/060,083, filed Aug. 2, 2020, and to U.S. Provisional Application No. 63/065,610, filed Aug. 14, 2020, the entire disclosures of which are hereby incorporated by reference herein.

TECHNICAL FIELD

Embodiments of the disclosure generally relate to methods for filling substrate features. More particularly, embodiments of the disclosure are directed to methods for filling a substrate feature with a seamless and close to bottom-up fill integrated method.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (finFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

Parasitic sub-fin capacitance and leakage is a chronic issue of GAA transistors and FinFETs, degrading the performance of the device. To suppress the leakage and the capacitance, an isolation is needed to block the current path. In microelectronics device fabrication there is a need to fill narrow trenches/openings having aspect ratios (AR) greater than 10:1 with no voiding. Atomic layer deposition (ALD) of low-k materials is traditionally used. This method, however, cannot meet the desired low dielectric constant (k) necessary to reduce leakage, and also induces seams that cause delamination and early break-down of the device. As the dimensions of the structures decrease and the aspect ratios increase, there is a need, therefore, for methods that replace current atomic layer deposition (ALD) of low-k dielectric films.

SUMMARY

One or more embodiments of the disclosure are directed to a processing method. The method comprises forming a dielectric film on a substrate surface through a process cycle, the process cycle comprising depositing a flowable low-k dielectric layer on the substrate surface and densifying the flowable low-k dielectric layer and form the dielectric film; and removing a portion of the dielectric film.

Another embodiment of the disclosure is directed to a processing method. The processing method comprises: forming a plurality of film stacks on a substrate, the film stack comprising alternating layers of silicon germanium (SiGe) and silicon (Si); etching the film stack to form an opening extending a depth from a top surface of the film stack to a bottom surface, the opening having a width defined by a first sidewall and a second sidewall; performing a process cycle comprising depositing a dielectric film on the first sidewall, the second sidewall, and the bottom surface of the opening and densifying the dielectric film; and removing a portion of the dielectric film.

Other embodiments of the disclosure are directed to a non-transitory computer readable medium including instructions, that, when executed by a controller of a processing chamber, causes the processing chamber to perform operations of: perform a process cycle comprising depositing a dielectric film on a first sidewall, a second sidewall, and a bottom surface of an opening extending a depth from a top surface of a film stack to a bottom surface and densifying the dielectric film; remove a portion of the dielectric film; and optionally, cure the dielectric film.

Another embodiment of the disclosure is directed to a processing method. In one or more embodiments, the processing method comprises: forming a dielectric film on a substrate surface through a process cycle, the process cycle comprising depositing a flowable low-k dielectric layer on the substrate surface and curing the flowable low-k dielectric layer to form the dielectric film; and removing a portion of the dielectric film.

A further embodiment of the disclosure if directed to processing method comprising: forming a plurality of film stacks on a substrate, the film stack comprising alternating layers of silicon germanium (SiGe) and silicon (Si); etching the film stack to form an opening extending a depth from a top surface of the film stack to a bottom surface, the opening having a width defined by a first sidewall and a second sidewall; performing a process cycle comprising depositing a dielectric film on the first sidewall, the second sidewall, and the bottom surface of the opening and curing the dielectric film; and removing a portion of the dielectric film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (finFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices.

Parasitic sub-fin capacitance and leakage is a chronic issue of GAA transistors, degrading the performance of the device. To suppress the leakage and the capacitance, an isolation is needed to block the current path. Atomic layer deposition (ALD) of low-k materials may be used. This method, however, cannot meet the desired low dielectric constant (k), e.g., a dielectric constant (k) less than 4, necessary to reduce leakage, and also induces seams that cause delamination and early break-down of the device. ALD low-k is not robust (dense) enough to sustain its initial film thickness from the downstream dry and/or wet etch processes. Accordingly, one or more embodiments provide a method to completely gap-fill the tight pitch and HAR structures of GAA transistor with a flowable low-k (k<3) dielectric material, densify the film, and selectively etch back to precisely place the film within the desired area. The method of one or more embodiments provides a low-k material for gap fill that is seam-free and has a dielectric constant, k-value, of the less than 3. In one or more embodiments, the method is a flowable process that is compatible with tight pitch and high aspect ratio structures.

Embodiments of the disclosure provide methods of depositing a film in high aspect ratio (AR) structures with small dimensions. Some embodiments advantageously provide methods involving cyclic deposition-plasma treatment-etch processes that can be performed in a cluster tool environment. In one or more embodiments, the plasma treatment minimizes the exposure of the film to moisture and effectively densifies the film. In one or more embodiments, the selective etch-back eliminates q-time and suppresses the incubation to provide tight control. In one or more embodiments, the integration of three processes into a single tool with no vacuum break introduces zero q-time for better process control. Some embodiments advantageously provide seam-free high-quality films to fill up high aspect ratio (AR) trenches/openings with small dimensions.

One or more embodiments of the disclosure are described with reference to the Figures. In the method of one or more embodiments, gate all-around transistors are fabricated using a standard process flow. In one or more embodiments, after the area is ready for isolation fill by selectively removing the sacrificial layer underneath the source, gate, and drain, a low-k gap-fill process is used to deposit a flowable film into the source, underneath the gate and drain. The film may be cured and then densified by plasma treatment or alternatively densified and then cured. This could be done integrated in a cluster tool without breaking vacuum. Alternatively, the film could be deposited on one tool and then break vacuum and densified and cured on another tool or tools. Without breaking the vacuum, plasma treatment densifies the low-k film to increase the wet and dry etch resistance. Without breaking the vacuum, selective etching selectively removes the excessive (overburden) low-k materials to precisely control the volume of the isolation. In other embodiments, the selective etching is performed after breaking vacuum.

Figure 1:
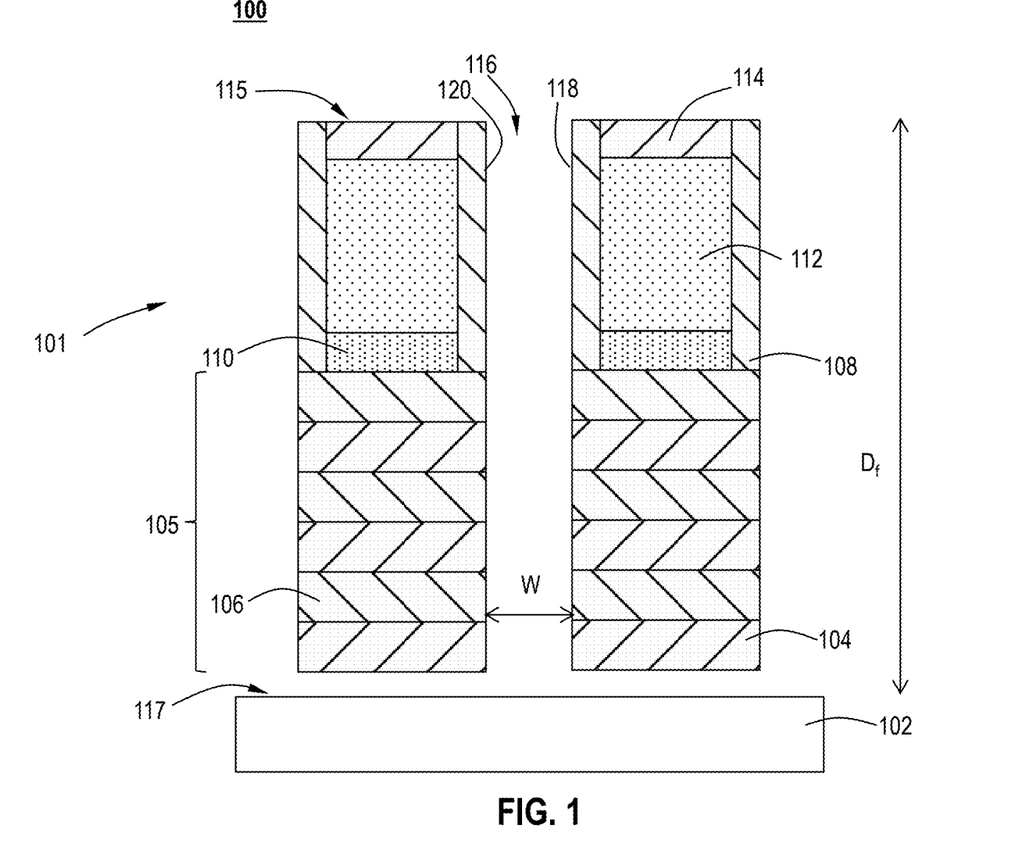
FIG. 1 shows a cross-sectional view of a GAA substrate in accordance with one or more embodiments of the disclosure.
Figure 2A:
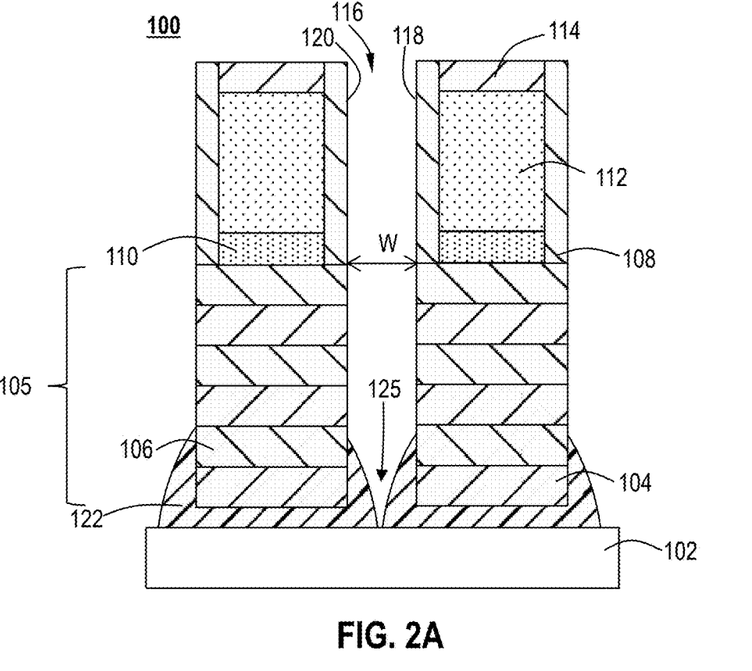
FIGS. 2A-2D shows a cross-sectional view of a GAA substrate in accordance with one or more embodiments of the disclosure.
Figure 2B:
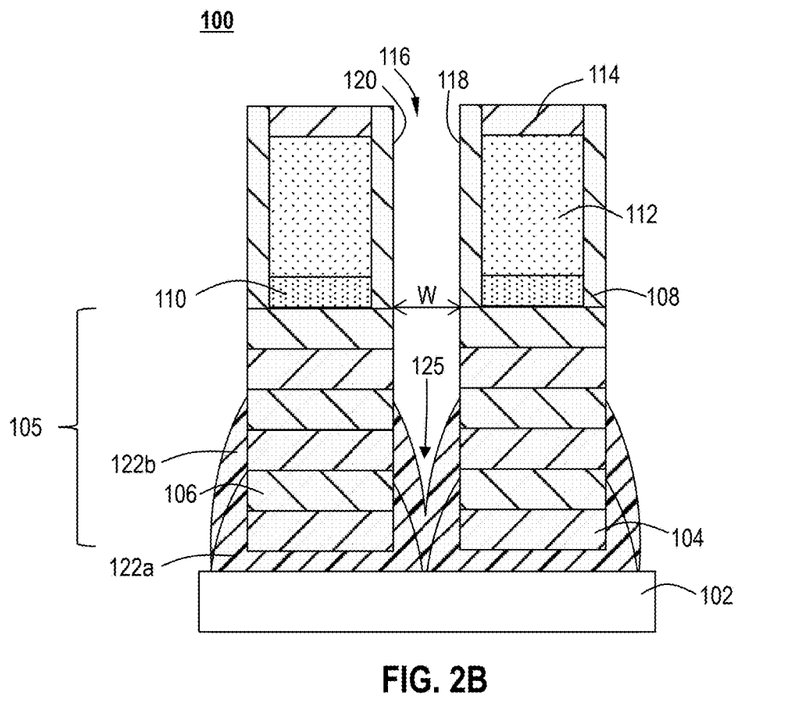
Figure 2C:
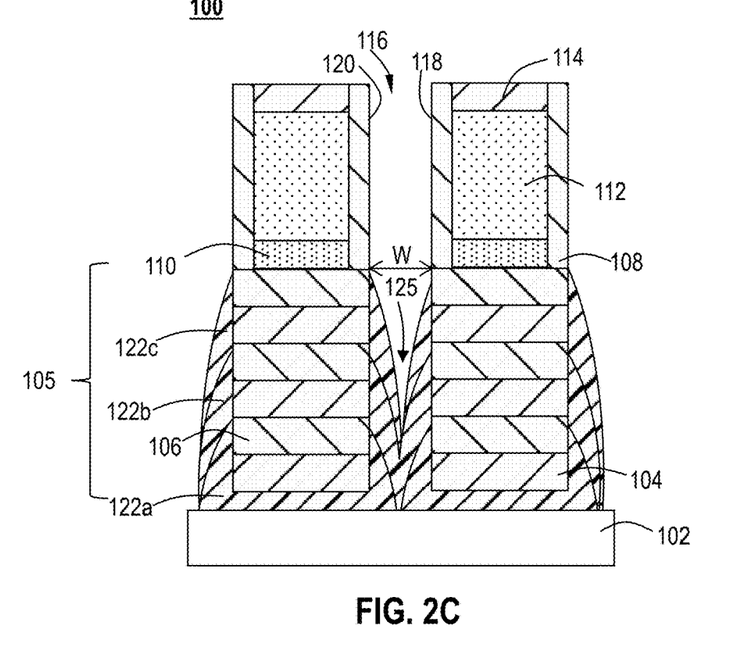
Figure 2D:
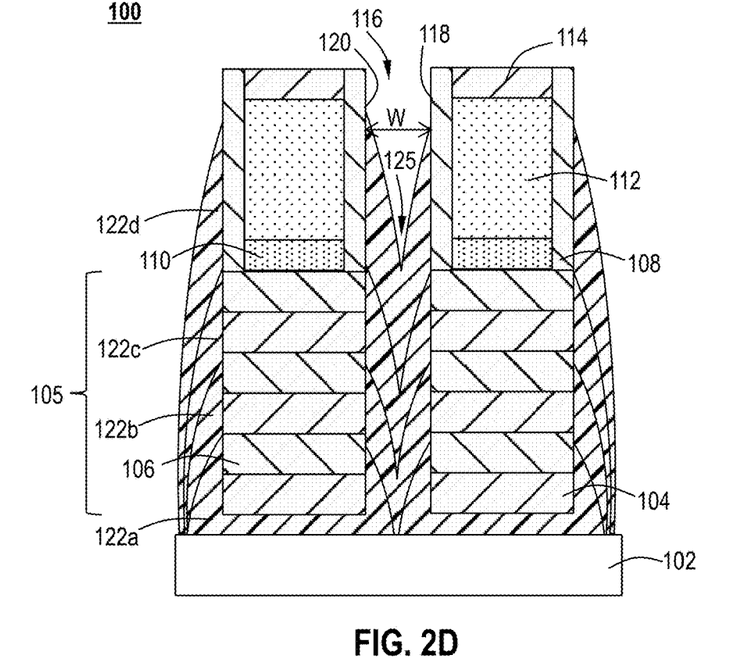

FIG. 1 shows a partial cross-sectional view of an electronic device 100 with a feature 116. The Figures show electronic devices having a single feature for illustrative purposes; however, those skilled in the art will understand that there can be more than one feature. The shape of the feature 116 can be any suitable shape including, but not limited to, trenches and vias. In one or more embodiments, the electronic device 100 includes a plurality of fins 101 and a plurality of gates 112 on the substrate surface 102.

As used in this regard, the term "feature" means any intentional surface irregularity. Suitable examples of features include, but are not limited to, trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

In one or more embodiments, the at least one feature 116 extends from a top surface 115 of the plurality of fins 101 to a feature depth $D_f$ to a bottom surface 117. The at least one feature 116 has a first sidewall 118 and a second sidewall 120 that define a width W of the at least one feature 116. In one or more embodiments, the open area formed by the sidewalls 118, 116 and bottom 117 are also referred to as a gap. In one or more embodiments, the width W is homogenous along the depth $D_f$ of the at least one feature 116. In other embodiments, the width, W, is greater at the top of the at least one feature 116 than the width, W, at the bottom surface 117 of the at least one feature 116.

In one or more embodiments, the at least one feature 116 comprises a memory hole or a word line slit. Accordingly, in one or more embodiments, the electronic device 100 comprises a gate all-around (GAA) transistor.

In one or more embodiments, the semiconductor substrate 102 can be any suitable substrate material. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the surface of the substrate 102 in order to prevent parasitic bottom device turn on. In one or more embodiments, a superlattice structure 105 is formed atop the first location. For example, in some embodiments, the surface of the substrate may have a dopant density about $10^{18}$ atoms/cm$^3$ to about $10^{19}$ atoms/cm$^3$.

In one or more embodiments, the fins 101 comprise at least one superlattice structure 105 formed atop the top surface of the substrate 102 (as depicted in FIG. 1). The superlattice structure 105 comprises a plurality of sacrificial layers 104 and a corresponding plurality of channel layers 106 alternatingly arranged in a plurality of stacked pairs. In some embodiments the plurality of stacked groups of layers comprises a silicon (Si) and silicon germanium (SiGe) group. In some embodiments, the plurality of sacrificial layers 104 and corresponding plurality of channel layers 106 can comprise any number of lattice matched material pairs suitable for forming a superlattice structure 105. In some embodiments, the plurality of sacrificial layers 104 and corresponding plurality of channel layers 106 comprise from about 2 to about 50 pairs of lattice matched materials.

Typically, a parasitic device will exist at the bottom of the superlattice structure 105. In some embodiments, implantation of a dopant in the substrate, as discussed above, is used to suppress the turn on of the parasitic device. In some embodiments, the substrate 102 is etched so that the bottom portion of the superlattice structure 105 includes a substrate portion which is not removed, allowing the substrate portion to act as the bottom release layer of the superlattice structure 105.

In one or more embodiments, the thicknesses of the sacrificial layers 104 and channel layers 106 in some embodiments are in the range of from about 2 nm to about 50 nm, in the range of from about 3 nm to about 20 nm, or in a range of from about 2 nm to about 15 nm. In some embodiments, the average thickness of the sacrificial layers 104 is within 0.5 to 2 times the average thickness of the channel layers 106.

In some embodiments, a replacement gate structure (e.g., a dummy gate structure) is formed over and adjacent to the superlattice structure 105. The dummy gate structure defines the dummy gate 112 of the transistor device. The dummy gate structure may be formed using any suitable conventional deposition and patterning process known in the art.

In one or more embodiments, the fin 101 comprises a gate oxide layer 110 on a top surface of the plurality of pairs of alternating layers of first material 104 and second material 106. The gate oxide layer 110 may comprise any suitable material known to the skilled artisan. The illustrated embodiment shows the gate oxide layer 110 as a conformal layer with a uniform shape. However, the skilled artisan will recognize that this is merely for illustrative purposes and that the gate oxide layer 110 can form in an isotropic manner so that the gate oxide layer 110 has a rounded appearance. In one or more embodiments, gate oxide layer 110 comprises a silicon oxide (SiO$_x$). While the term "silicon oxide" may be used to describe the gate oxide layer 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, tungsten oxide, zirconium oxide, aluminum oxide, hafnium oxide, and the like.

In one or more embodiments, a channel 106 is on a top surface of the gate oxide 110. As used herein, the term "channel" refers to a layer of material that is an electrical conductor. In one or more embodiments, the channel 106 comprises one or more silicon, polysilicon, amorphous silicon, doped silicon, strained silicon, silicon on insulator (SOI), carbon doped silicon dioxides, SiGe, germanium, gallium arsenide, GaN, InP, carbon nanotube, and the like.

In some embodiments, sidewall spacers 108 are formed along outer sidewalls of the channel 106. The sidewall spacers 118 of some embodiments comprise suitable insulating materials known in the art, for example, silicon carbonitride (SiCN), silicon borocarbonitride (SiBCN), silicon oxycarbonitride (SiOCN), or the like. In one or more embodiments, an insulating layer 114, such as a hard mask to pattern or form a dummy gate structure, is on the top surface of the dummy gate 112. The insulating layer 114 may comprise any suitable material known to the skilled artisan. In one or more embodiments, the insulating layer 114 comprises silicon nitride (SiN), silicon oxide (SiOx), or a combination (e.g., stacked on top of one another).

Figure 4:
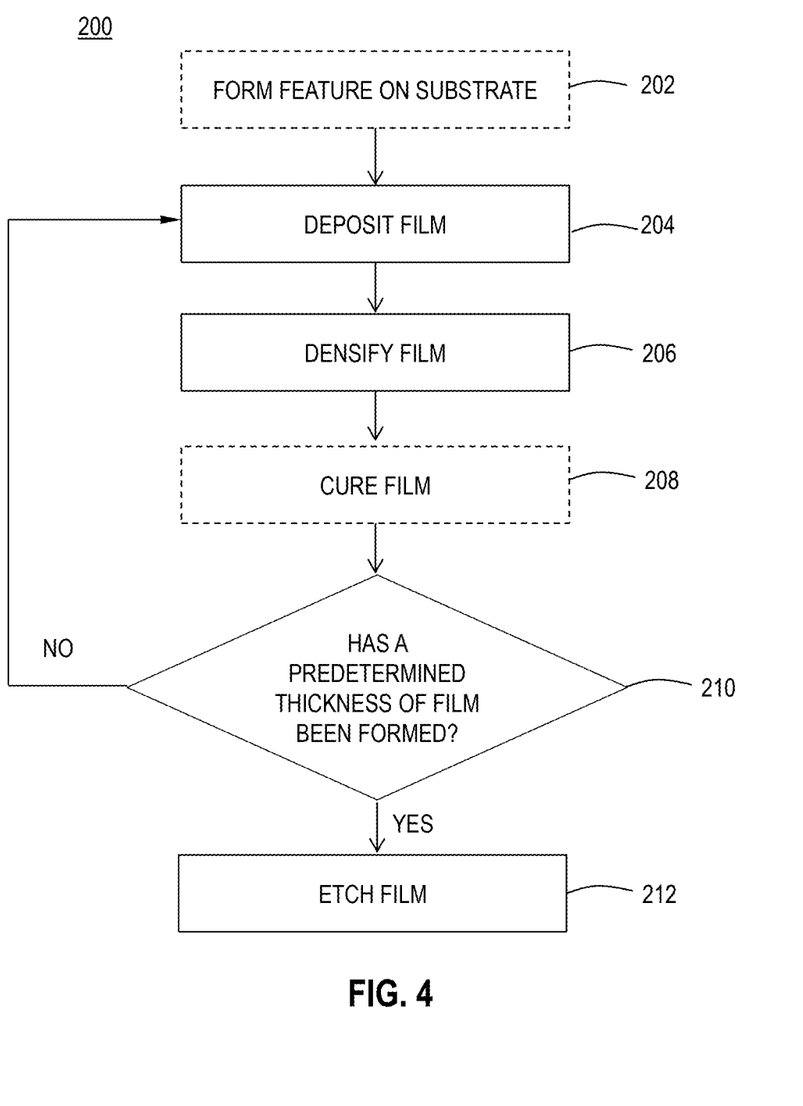
FIG. 4 shows a process flow in accordance with one or more embodiments of the disclosure.

FIGS. 2A through 2D illustrate partial cross-sectional views of an electronic device in accordance with one or more embodiments of the disclosure. FIG. 4 illustrates a process flow diagram of a method 200 according to one or more embodiments. With reference to FIGS. 2A through 2D and FIG. 4, in one or more embodiments, at least one feature 116 is formed on an electronic device 100. In some embodiments, the electronic device 100 is provided for processing. As used in this regard, the term "provided" means that the substrate is placed into a position or environment for further processing. In one or more embodiments, the electronic device 100 has at least one feature 116 already formed thereon. In other embodiments, at operation 202, at least one feature 116 is formed on electronic device 100. In one or more embodiments, the at least one feature extends a feature depth, D$_f$, from the substrate surface to a bottom surface, the at least one feature having a width, W, defined by a first sidewall 118 and a second sidewall 120.

In one or more embodiments, at operation 204, a film 122 is formed on the substrate surface 102 and the sidewalls 118, 120 and the bottom 117 of the at least one feature 116. In one or more embodiments, the film 122 may have a void or a gap or a seam 125 located within the width, W, of the at least one feature 116.

In one or more embodiments, the film 122 can be comprised of any suitable material. In some embodiments, the film 122 comprises a flowable low-k dielectric material. In one or more embodiments, film 122 includes a dielectric material having a dielectric constant, κ-value, less than 4, or less than 3, or less than 2. In one or more embodiments, film 122 includes a dielectric material having a κ-value less than 3. In at least some embodiments, film 122 includes oxides, carbon doped oxides, porous silicon dioxide, carbides, oxycarbides, nitrides, oxynitrides, oxycarbonitrides, polymers, phosphosilicate glass, fluorine doped silicon dioxide, organosilicate glass (OSG), fluorosilicate (SiOF) glass, organosilicate glass (SiOCH), spin-on organic polymer dielectrics, spin-on silicon based polymeric dielectric materials, air gaps, or any combinations thereof, other electrically insulating layers determined by an electronic device design, or any combination thereof. In at least some embodiments, film 122 may include polyimide, epoxy, photodefinable materials, such as benzocyclobutene (BCB), and WPR-series materials, or spin-on-glass.

In one or more embodiments, the film 122 is formed by flowable chemical vapor deposition (FCVD) or plasma-enhanced chemical vapor deposition (PECVD).

The PECVD process of some embodiments comprises exposing the substrate surface to a reactive gas or a reactant gas. The reactive gas can include a mixture of one or more species. In one or more embodiments, the reactant gas comprises one or more of argon (Ar), oxygen ($O_2$), hydrogen ($H_2$), nitrogen ($N_2$), hydrogen/nitrogen ($H_2/N_2$), and ammonia ($NH_3$).

In one or more embodiments, the PECVD process of some embodiments comprises exposing the substrate surface to a precursor or a mixture of precursors. In some embodiments, the precursor may comprise any suitable organo-silane known to the skilled artisan. In other embodiments, the precursor or mixture of precursors is selected from one or more of siloxanes, carbo-silanes, octamethylcyclotetrasiloxane (OMCTS), tetramethylcyclotetrasiloxane (TMCTS), octadecyltrichlorosilane (OTS), hexamethyldisiloxane (HMDSO), tetramethyldisiloxane (TMDSO), tetraethoxysilane (TEOS), bis(trimethylsilyl)methane (BTMSM), methylenebis(dimethylsilane), methylenebis(methylsilane), methylenedisilane, silane, disilane, and trisilylamine. IN specific embodiments, the precursor or a mixture of precursors comprises one or more of OMCTS and TMOS.

The plasma gas can be any suitable gas that can be ignited to form a plasma and/or can act as a carrier or diluent for the precursor. In one or more embodiments, the plasma gas comprises one or more of ammonia ($NH_3$), oxygen ($O_2$), and nitrous oxide ($N_2O$), and the plasma gas may be used as a plasma treatment to activate one or more of the precursors.

In one or more embodiments, a high plasma density dissociates the reactant gases (e.g., argon (Ar), oxygen ($O_2$), hydrogen ($H_2$), nitrogen ($N_2$), hydrogen/nitrogen ($H_2/N_2$), and ammonia ($NH_3$)) to generate radicals, which then react with other precursors downstream in the chamber to result in a flowable low-k dielectric film 122 on the substrate 102. In one or more embodiments, this flowable deposition suppresses any gap-fill void or seam in the feature 116.

In one or more embodiments, the plasma comprises one or more of nitrogen ($N_2$), argon (Ar), helium (He), hydrogen ($H_2$), carbon monoxide (CO), oxygen ($O_2$), ammonia ($NH_3$), nitrous oxide ($N_2O$), carbon dioxide ($CO_2$), or oxygen ($O_2$). In some embodiments, the plasma is a remote plasma.

In one or more embodiments, the plasma may be generated remotely or within the processing chamber.

In one or more embodiments, the deposition process is carried out in a process volume at pressures ranging from 0.1 mTorr to 10 Torr or ranging from 0.5 Torr to 5.0 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The precursor-containing gas mixture may further include one or more dilution gas selected from helium (He), argon (Ar), xenon (Xe), nitrogen ($N_2$), or hydrogen ($H_2$). The dilution gas of some embodiments comprises a compound that is inert gas relative to the reactants and substrate materials.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz, and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 10 kW.

In one or more embodiments, the flowable film 122 can be formed at any suitable temperature. In some embodiments, the flowable film 122 is formed at a temperature in the range of about −10° C. to about 600° C.

In some embodiments, the film 122 forms conformally on the at least one feature 116. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by CVD in various embodiments of the disclosure would provide coverage over the deposited region of essentially uniform thickness on complex surfaces.

In some embodiments, the film 122 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

Some embodiments of the disclosure are directed to methods for bottom-up gapfill of a feature 116. A bottom-up gapfill process fills the feature 116 from the bottom versus a conformal process which fills the feature 116 from the bottom and sides. The flowable film 122 fills the at least one feature 116 so that substantially no seam is formed in the final device. A seam 125 is a gap that forms in the feature 116 between, but not necessarily in the middle of, the sidewalls 118, 120 of the feature 116. As used in this regard, the term "substantially no seam" means that any gap formed in the film 122 between the sidewalls 118, 120 is less than about 1% of the cross-sectional area of the sidewall.

In one or more embodiments, the flowable film 122 deposits on the substrate 102 (temperature of the substrate can be from −10° C. to 600° C.) and due to their flowability, flow through trenches and make a gap-fill.

Referring to FIG. 4, at operation 206, the film 122 is densified by low temperature inductive coupled plasma (ICP) treatment (<600° C.) using ion bombardment energy. In one or more embodiments, the ICP treatment improves not only film quality, such as low wet etch rate, but also improves electrical properties such as leakage current/breakdown voltage.

At operation 208, film 122 is, optionally, cured. The film 122 may be cured by any suitable means known to the skilled artisan. In some embodiments, the film 122 may be cured by ultraviolet (UV) energy. In one or more embodiments, film 122 is cured by exposing the flowable low-k film 122 to ultraviolet (UV) light. In other embodiments, the film may be cured by thermally treatment, for example, by heating the film to 300° C.-600° C. in and inert (Ar, He, $N_2$, Xe) or $NH_3$ environment. Specifically, the film 122 may be cured by rapid thermal processing (RTP) or in a batch furnace. Additionally, other methods of curing including, but not limited to, exposure to microwave radiation may be applied.

In one or more embodiments, at decision point 210, it is determined whether the film 122 has achieved a predetermined thickness with no seam. If the predetermined thickness has not been achieved, the method 200 returns to operation 204 to continue forming the film 122 until the predetermined thickness and seam closure is reached. FIGS. 2A-2D illustrate multiple process cycles where flowable film 122 is deposited. Once the predetermined thickness has been reached, the method 200 proceeds to operation 212.

Figure 3:
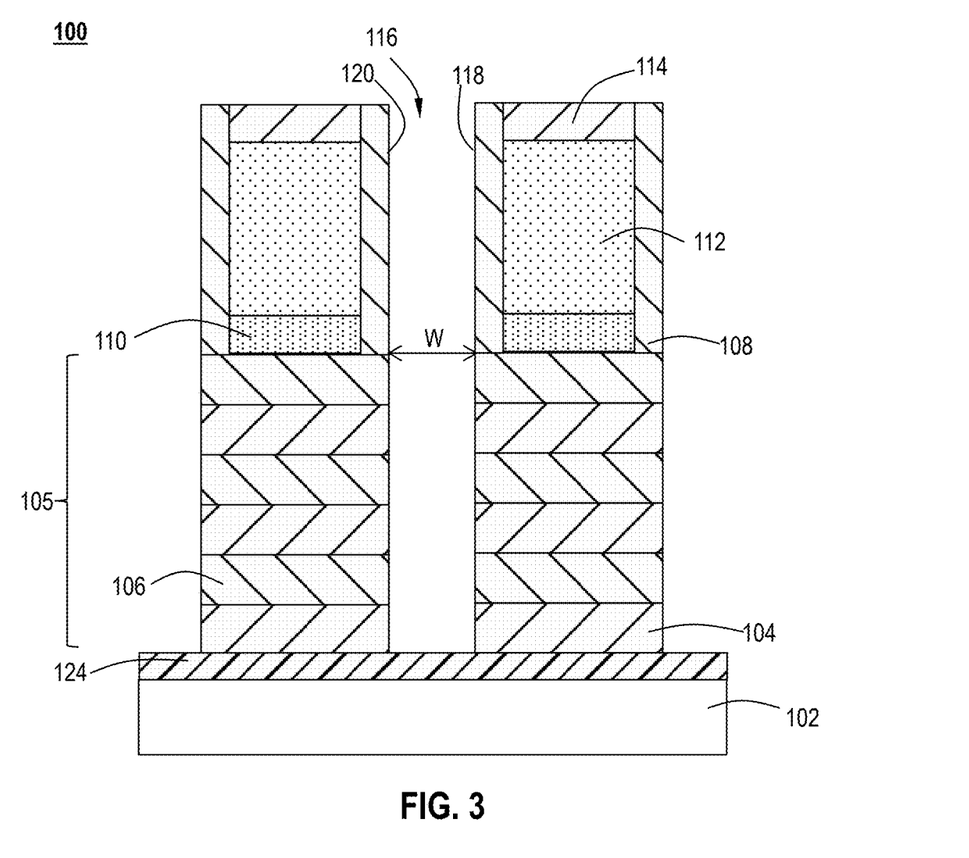
FIG. 3 shows a cross-sectional view of a GAA substrate in accordance with one or more embodiments of the disclosure.

Referring to FIGS. 3 and 4, at operation 212, film 122 is etched from the sidewalls 118, 120 of the feature to form a low-k film 124 on the substrate. The etching process may include a dry etch process, a wet etch process, or a combination of both. In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, a surface is exposed to $H_2$, $NF_3$, and/or $NH_3$ plasma species, e.g., plasma-excited hydrogen and fluorine species. For example, in some embodiments, surface 229 may undergo simultaneous exposure to $H_2$, $NF_3$, and $NH_3$ plasma. The SiCoNi™ etch process may be performed in a SiCoNi™ chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called "HF last" process, in which HF etching of film 122 is performed that leaves film 124 hydrogen-terminated. The etch process can be plasma or thermally based. The plasma processes can be any suitable plasma (e.g., conductively coupled plasma, inductively coupled plasma, microwave plasma).

In one or more embodiments, the low-k film 124 that is formed after etching has a substantially uniform thickness. As used herein, the term "substantially uniform" refers to film thicknesses that are within ±5 nm, ±4 nm, ±3 nm, ±2 nm or ±1 nm of the films formed.

Figure 5:
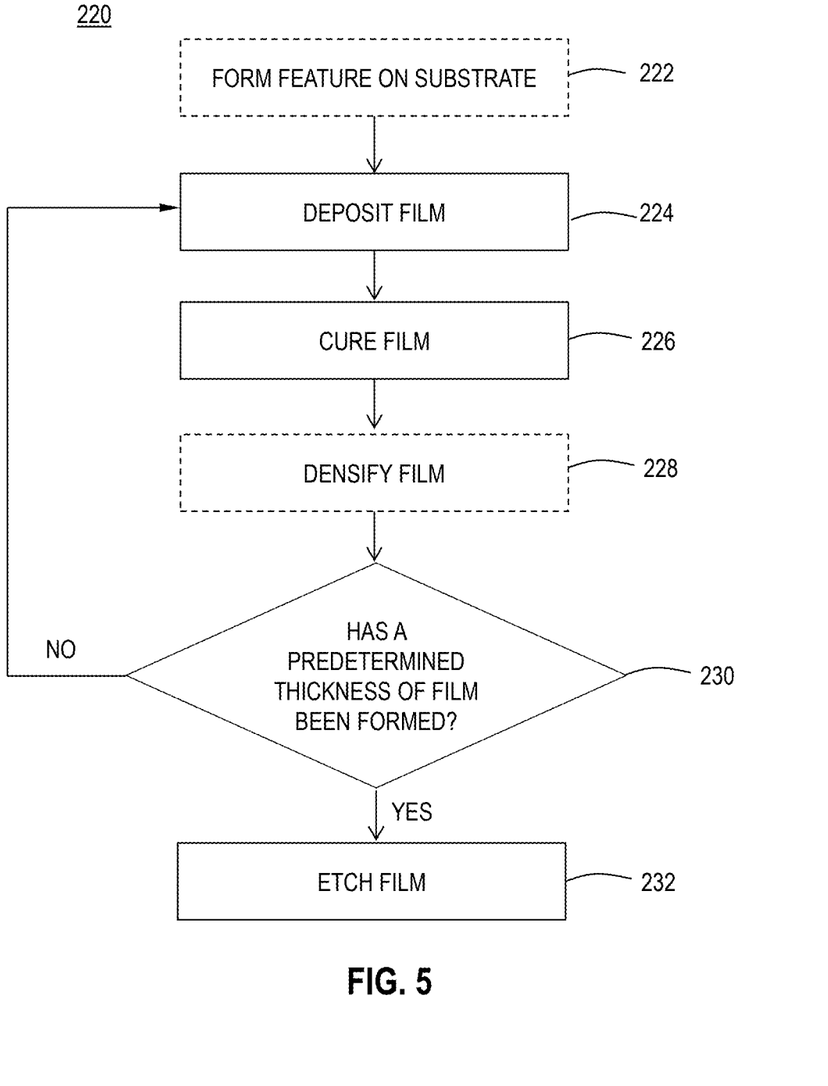
FIG. 5 shows a process flow in accordance with one or more embodiments of the disclosure.

FIG. 5 illustrates a process flow diagram of a method 220 according to one or more embodiments. With reference to FIGS. 2A through 2D and FIG. 5, in one or more embodiments, at least one feature 116 is formed on an electronic device 100. In some embodiments, the electronic device 100 is provided for processing. In one or more embodiments, the electronic device 100 has at least one feature 116 already formed thereon. In other embodiments, at operation 222, at least one feature 116 is formed on electronic device 100. In one or more embodiments, the at least one feature extends a feature depth, $D_f$, from the substrate surface to a bottom surface, the at least one feature having a width, W, defined by a first sidewall 118 and a second sidewall 120.

In one or more embodiments, at operation 224, a film 122 is formed on the substrate surface 102 and the sidewalls 118, 120 and the bottom 117 of the at least one feature 116. In one or more embodiments, the film 122 may have a void or a gap or a seam 125 located within the width, W, of the at least one feature 116.

Referring to FIG. 5, at operation 226, the film 122 is cured. The film 122 may be cured by any suitable means known to the skilled artisan. In some embodiments, the film 122 may be cured by ultraviolet (UV) energy. In one or more embodiments, film 122 is cured by exposing the flowable low-k film 122 to ultraviolet (UV) light. In other embodiments, the film may be cured by thermally treatment, for example, by heating the film to 300° C.-600° C. in and inert (Ar, He, $N_2$, Xe) or $NH_3$ environment. Specifically, the film 122 may be cured by rapid thermal processing (RTP) or in a batch furnace. Additionally, other methods of curing including, but not limited to, exposure to microwave radiation may be applied.

At operation 228, the film 122 is, optionally, densified by low temperature inductive coupled plasma (ICP) treatment (<600° C.) using ion bombardment energy. In one or more embodiments, the ICP treatment improves not only film quality, such as low wet etch rate, but also improves electrical properties such as leakage current/breakdown voltage.

In one or more embodiments, at decision point 230, it is determined whether the film 122 has achieved a predetermined thickness with no seam. If the predetermined thickness has not been achieved, the method 220 returns to operation 224 to continue forming the film 122 until the predetermined thickness and seam closure is reached.

In one or more embodiments, at operation 232, film 122 is etched from the sidewalls 118, 120 of the feature to form a low-k film 124 on the substrate. The etching process may include a dry etch process, a wet etch process, or a combination of both.

Figure 6:
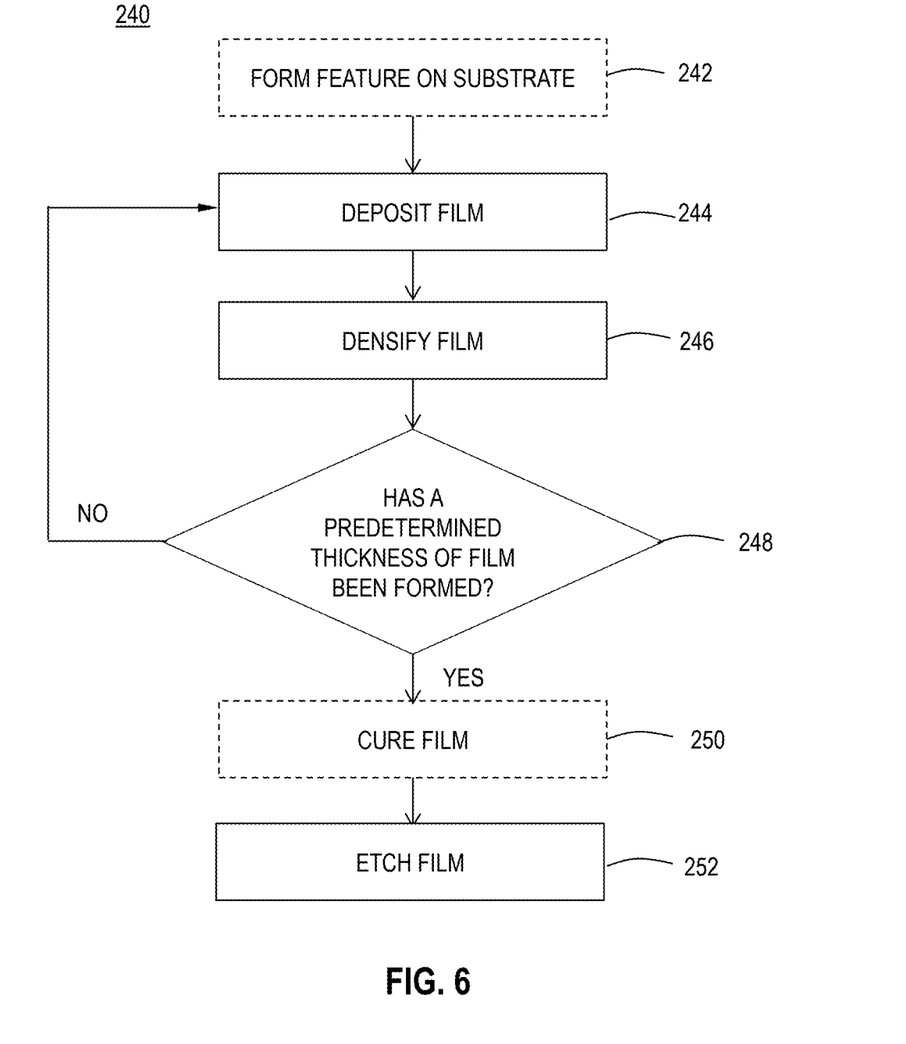
FIG. 6 shows a process flow in accordance with one or more embodiments of the disclosure.

FIG. 6 illustrates a process flow diagram of a method 240 according to one or more embodiments. With reference to FIGS. 2A through 2D and FIG. 6, in one or more embodiments, at least one feature 116 is formed on an electronic device 100. In some embodiments, the electronic device 100 is provided for processing. In one or more embodiments, the electronic device 100 has at least one feature 116 already formed thereon. In other embodiments, at operation 242, at least one feature 116 is formed on electronic device 100. In one or more embodiments, the at least one feature extends a feature depth, $D_f$, from the substrate surface to a bottom surface, the at least one feature having a width, W, defined by a first sidewall 118 and a second sidewall 120.

In one or more embodiments, at operation 244, a film 122 is formed on the substrate surface 102 and the sidewalls 118, 120 and the bottom 117 of the at least one feature 116. In one or more embodiments, the film 122 may have a void or a gap or a seam 125 located within the width, W, of the at least one feature 116.

Referring to FIG. 6, at operation 246, the film 122 is densified by low temperature inductive coupled plasma (ICP) treatment (<600° C.) using ion bombardment energy. In one or more embodiments, the ICP treatment improves not only film quality, such as low wet etch rate, but also improves electrical properties such as leakage current/breakdown voltage.

In one or more embodiments, at decision point 248, it is determined whether the film 122 has achieved a predetermined thickness with no seam. If the predetermined thickness has not been achieved, the method 240 returns to operation 244 to continue forming the film 122 until the predetermined thickness and seam closure is reached.

Upon the desired thickness being obtained, at operation 250, the film 122 is, optionally, cured. The film 122 may be cured by any suitable means known to the skilled artisan. In some embodiments, the film 122 may be cured by ultraviolet (UV) energy. In one or more embodiments, film 122 is cured by exposing the flowable low-k film 122 to ultraviolet (UV) light. In other embodiments, the film may be cured by thermal treatment, for example, by heating the film to 300° C.-600° C. in and inert (Ar, He, $N_2$, Xe) or $NH_3$ environment. Specifically, the film 122 may be cured by rapid thermal processing (RTP) or in a batch furnace. Additionally, other methods of curing including, but not limited to, exposure to microwave radiation may be applied.

In one or more embodiments, at operation 252, the film 122 is etched from the sidewalls 118, 120 of the feature to form a low-k film 124 on the substrate. The etching process may include a dry etch process, a wet etch process, or a combination of both.

Figure 7:
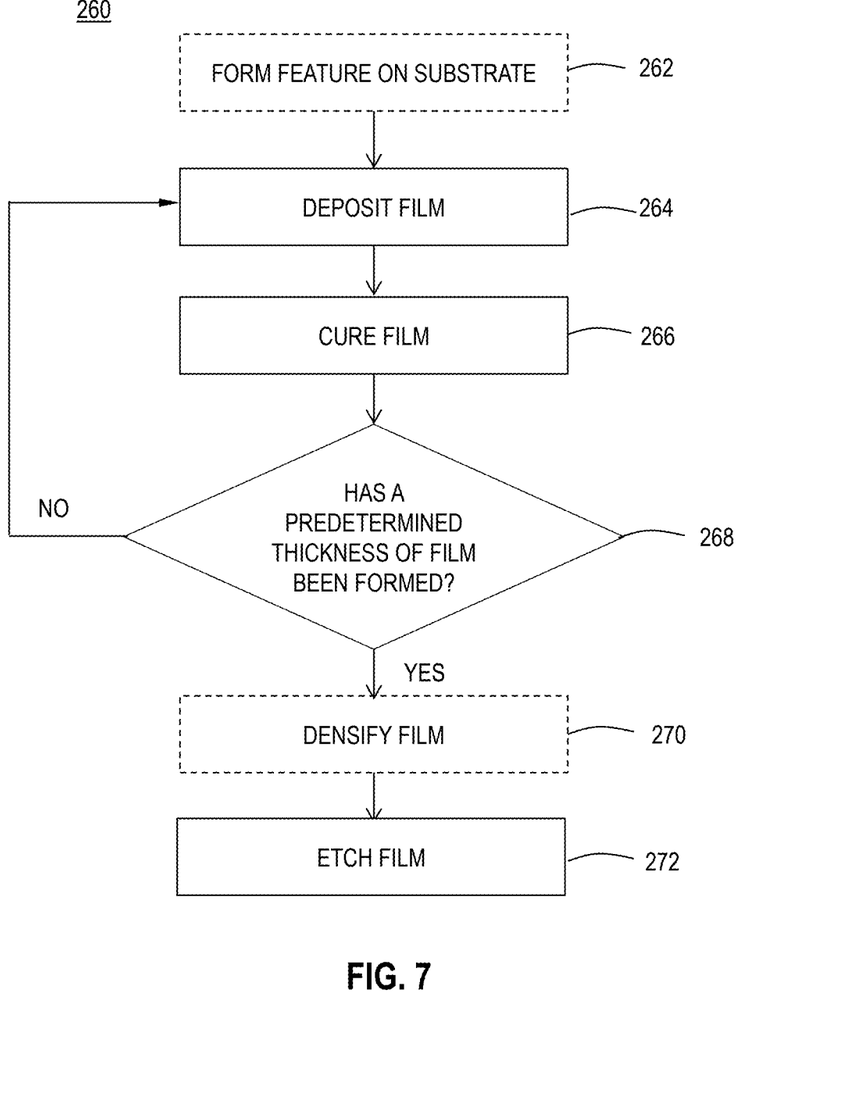
FIG. 7 shows a process flow in accordance with one or more embodiments of the disclosure.

FIG. 7 illustrates a process flow diagram of a method 260 according to one or more embodiments. With reference to FIGS. 2A through 2D and FIG. 7, in one or more embodiments, at least one feature 116 is formed on an electronic device 100. In some embodiments, the electronic device 100 is provided for processing. In one or more embodiments, the electronic device 100 has at least one feature 116 already formed thereon. In other embodiments, at operation 262, at least one feature 116 is formed on electronic device 100. In one or more embodiments, the at least one feature extends a feature depth, $D_f$, from the substrate surface to a bottom surface, the at least one feature having a width, W, defined by a first sidewall 118 and a second sidewall 120.

In one or more embodiments, at operation 264, a film 122 is formed on the substrate surface 102 and the sidewalls 118, 120 and the bottom 117 of the at least one feature 116. In one or more embodiments, the film 122 may have a void or a gap or a seam 125 located within the width, W, of the at least one feature 116.

Referring to FIG. 7, at operation 266, the film 122 is cured. The film 122 may be cured by any suitable means known to the skilled artisan. In some embodiments, the film 122 may be cured by ultraviolet (UV) energy. In one or more embodiments, film 122 is cured by exposing the flowable low-k film 122 to ultraviolet (UV) light. In other embodiments, the film may be cured by thermal treatment, for example, by heating the film to 300° C.-600° C. in and inert (Ar, He, $N_2$, Xe) or $NH_3$ environment. Specifically, the film 122 may be cured by rapid thermal processing (RTP) or in a batch furnace. Additionally, other methods of curing including, but not limited to, exposure to microwave radiation may be applied.

In one or more embodiments, at decision point 268, it is determined whether the film 122 has achieved a predetermined thickness with no seam. If the predetermined thickness has not been achieved, the method 260 returns to operation 264 to continue forming the film 122 until the predetermined thickness and seam closure is reached.

Upon the desired thickness being obtained, at operation 270, the film 122 is, optionally, densified by low temperature inductive coupled plasma (ICP) treatment (<600° C.) using ion bombardment energy. In one or more embodiments, the ICP treatment improves not only film quality, such as low wet etch rate, but also improves electrical properties such as leakage current/breakdown voltage.

In one or more embodiments, at operation 272, the film 122 is etched from the sidewalls 118, 120 of the feature to form a low-k film 124 on the substrate. The etching process may include a dry etch process, a wet etch process, or a combination of both.

Figure 8:
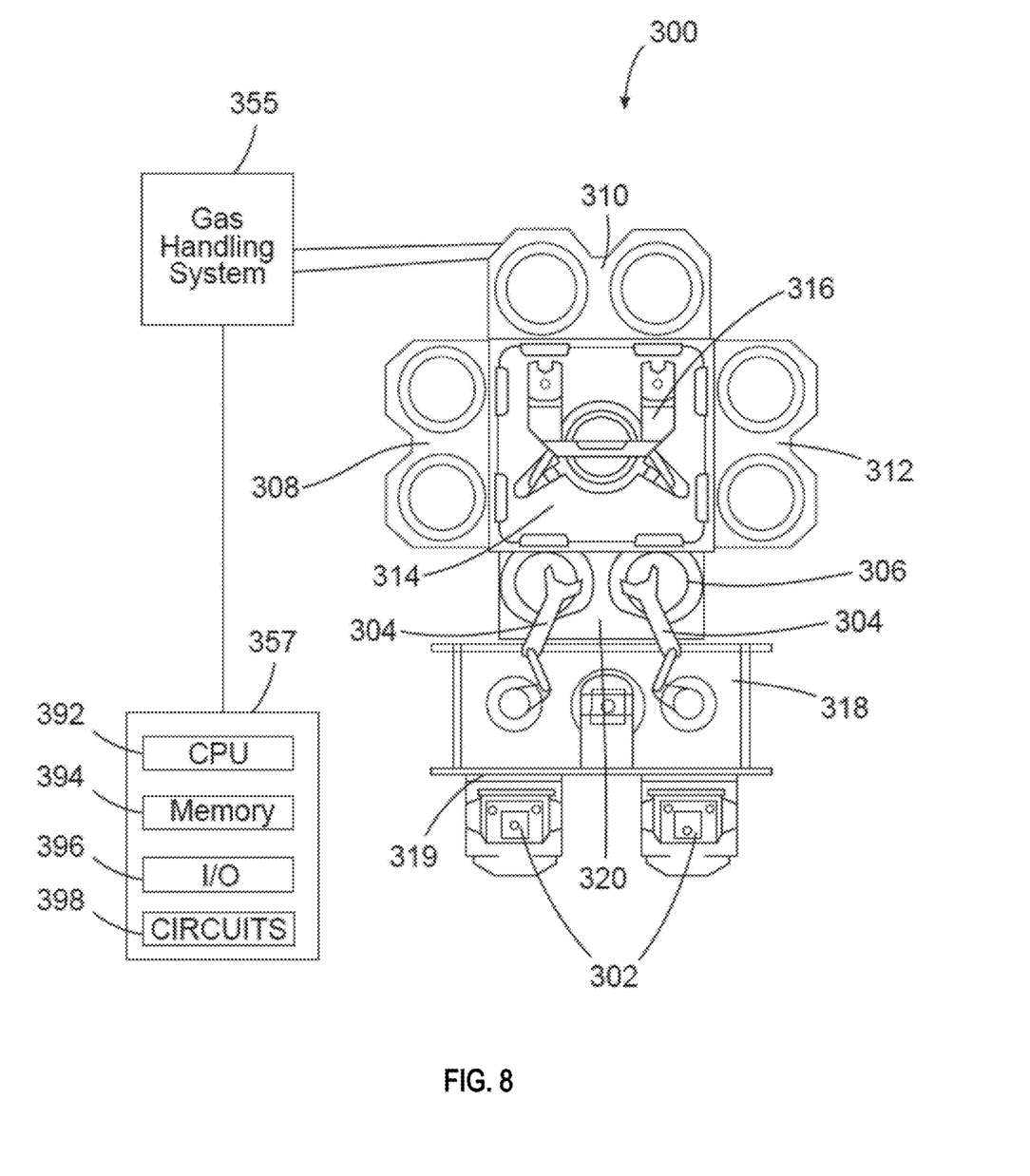
FIG. 8 illustrates a cluster tool according to one or more embodiments.

Additional embodiments of the disclosure are directed to processing tools 300 for the formation of the GAA devices and methods described, as shown in FIG. 3. A variety of multi-processing platforms, including the Centura®, Dual ACP, Producer® GT, and Endura® platform, available from Applied Materials® as well as other processing systems may be utilized. With reference to FIG. 8, a cluster tool 300 includes at least one central transfer station 314 with a plurality of sides. A robot 316 is positioned within the central transfer station 314 and is configured to move a robot blade and a wafer to each of the plurality of sides.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

Referring to FIG. 8, the cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a preclean chamber, a deposition chamber, an annealing chamber, an etching chamber, a selective etching chamber, and the like. The particular arrangement of process chambers and components can be varied depending on the cluster tool and should not be taken as limiting the scope of the disclosure.

In some embodiments, the cluster tool 300 includes an isotropic etching chamber for selectively etching/trimming the semiconductor material layers 224. The isotropic etching chamber of some embodiments comprises one or more a fluorine-based dry etching chamber. In some embodiments, the cluster tool 300 includes a pre-cleaning chamber connected to the central transfer station.

In the embodiment shown in FIG. 8, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the deposition of flowable low-k dielectric material 122 on the substrate 102, densification of film 122 using plasma, optional curing of the film 122, and etch back to form a uniform film 124.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma chamber, a curing chamber, an etching chamber; and a controller connected to the central transfer station and the plurality of process stations, the controller configured to activate the robot to move the wafer between process stations, and to control a process occurring in each of the process stations.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   forming a dielectric film on a substrate surface through a process cycle, the substrate surface having a plurality of fins including a plurality of gates on a superlattice structure, and at least one feature separating each of the plurality of fins, the at least one feature comprising a bottom surface, a first sidewall, and a second sidewall, the process cycle comprising depositing a first flowable low-k dielectric layer directly on the bottom surface, on the first sidewall and on the second sidewall of the at least one feature, the first flowable low-k dielectric layer having a seam within the at least one feature, depositing a plurality of subsequent flowable low-k dielectric layers to fill the at least one feature and have substantially no seam within the at least one feature adjacent to the superlattice structure, and densifying the plurality of subsequent flowable low-k dielectric layers to form the dielectric film, the dielectric film having a dielectric constant (k) of less than about 3; and
   etching the dielectric film from the first sidewall and the second sidewall to leave the dielectric film on the bottom surface.

2. The method of claim 1, wherein a high density plasma dissociates reactant gases to generate radicals, the radicals reacting with precursors to form the flowable low-k dielectric layer, the high density plasma comprising one or more of nitrogen ($N_2$), argon (Ar), helium (He), hydrogen ($H_2$), carbon monoxide (CO), carbon dioxide ($CO_2$), nitrous oxide ($N_2O$), ammonia ($NH_3$), or oxygen ($O_2$).

3. The method of claim 1, wherein densifying the flowable low-k dielectric layer comprises treating the flowable low-k dielectric layer with inductively coupled plasma (ICP) at a temperature less than about 600° C.

4. The method of claim 1, wherein the method is performed in a processing chamber without breaking vacuum.

5. The method of claim 1, wherein the superlattice structure comprises alternating layers of silicon germanium (SiGe) and silicon (Si).

6. The method of claim 1, further comprising curing the dielectric film after densifying the film.

7. The method of claim 6, wherein curing comprises one or more of thermal processing, microwave radiation exposure, and UV curing.

8. The method of claim 1, further comprising repeating the process cycle.

9. A processing method comprising:
   forming a dielectric film on a substrate surface through a process cycle, the substrate surface having a plurality of fins including a plurality of gates on a superlattice structure, and at least one feature separating each of the plurality of fins, the at least one feature comprising a bottom surface, a first sidewall, and a second sidewall, the process cycle comprising depositing a first flowable low-k dielectric layer directly on the bottom surface, on the first sidewall and on the second sidewall of the at least one feature, the first flowable low-k dielectric layer having a seam within the at least one feature, depositing a plurality of subsequent flowable low-k dielectric layers to fill the at least one feature and have substantially no seam within the at least one feature adjacent to the superlattice structure, and curing the plurality of subsequent flowable low-k dielectric layers to form the dielectric film, the dielectric film having a dielectric constant (k) of less than about 3; and etching the dielectric film from the first sidewall and the second sidewall to leave the dielectric film on the bottom surface.

10. The method of claim 9, wherein a high density plasma dissociates reactant gases to generate radicals, the radicals reacting with precursors to form the flowable low-k dielectric layer, the high density plasma comprising one or more of nitrogen ($N_2$), argon (Ar), helium (He), hydrogen ($H_2$), carbon monoxide (CO), carbon dioxide ($CO_2$), nitrous oxide ($N_2O$), ammonia ($NH_3$), or oxygen ($O_2$).

11. The method of claim 9, wherein the method is performed in a processing chamber without breaking vacuum.

12. The method of claim 9, wherein the superlattice structure comprises alternating layers of silicon germanium (SiGe) and silicon (Si).

13. The method of claim 9, wherein curing comprises one or more of thermal processing, microwave radiation exposure, and UV curing.

14. The method of claim 9, further comprising densifying the dielectric film after curing the film.

15. The method of claim 14, wherein densifying the dielectric film comprises treating the dielectric film with inductively coupled plasma (ICP) at a temperature less than about 600° C.

16. The method of claim 9, further comprising repeating the process cycle.

* * * * *